United States Patent
Itoh et al.

(10) Patent No.: US 7,157,684 B2
(45) Date of Patent: Jan. 2, 2007

(54) RECEIVING CIRCUIT FOR FREE-SPACE OPTICAL COMMUNICATION

(75) Inventors: Hiroaki Itoh, Kashihara (JP); Naruichi Yokogawa, Kashihara (JP); Takao Matsui, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 87 days.

(21) Appl. No.: 10/928,087

(22) Filed: Aug. 30, 2004

(65) Prior Publication Data

US 2005/0061954 A1 Mar. 24, 2005

(30) Foreign Application Priority Data

Sep. 24, 2003 (JP) ............... 2003-331032

(51) Int. Cl.
G01J 1/44 (2006.01)
H03F 3/08 (2006.01)
H04B 10/06 (2006.01)

(52) U.S. Cl. .............................. 250/214 R; 250/214 A; 330/308; 398/209

(58) Field of Classification Search ......... 250/214 LA, 250/214 A, 214 R; 398/202, 209; 330/308, 330/259, 278, 290, 291
See application file for complete search history.

(56) References Cited

U.S. PATENT DOCUMENTS 6,456,141 B1 * 9/2002 Nishizono et al. .......... 327/345
6,771,132 B1 * 8/2004 Denoyer et al. ............ 330/308

FOREIGN PATENT DOCUMENTS

JP 6-188835 A 7/1994

* cited by examiner

Primary Examiner—Thanh X. Luu
Assistant Examiner—Pascal M. Bui-Pho
(74) Attorney, Agent, or Firm—Birch, Stewart, Kolasch & Birch, LLP

(57) ABSTRACT

An amplifier circuit amplifies the difference between an output voltage from a current voltage conversion circuit and a bias voltage. The current voltage conversion circuit converts a photocurrent of a photodiode which detect incoming light into a voltage. A gm-amp charges or discharges a capacity by a current corresponding to the difference between the output voltage from the amplifier circuit and a reference voltage. A field effect transistor supplies a drain current, which is controlled by voltages at the respective terminals of the capacity, to the photodiode, in order to prevent the output voltage of the amplifier circuit from being varied due to the influence of a DC photocurrent flowing in the photodiode. The gate of a field effect transistor, which is connected in parallel to a current voltage conversion resistor, has an identical voltage with the gate of the field effect transistor.

10 Claims, 4 Drawing Sheets

RECEIVING CIRCUIT FOR FREE-SPACE OPTICAL COMMUNICATION

This Nonprovisional application claims priority under 35 U.S.C. § 119(a) on patent application Ser. No. 2003/331032 filed in Japan on Sep. 24, 2003, the entire contents of which are hereby incorporated by reference.

FIELD OF THE INVENTION

The present invention relates to a receiving circuit for free-space optical communication, which adopts a photodiode as a photoreceptor, and particularly relates to a receiving circuit for free-space optical communication, which is free from the malfunction caused by shot noise in the photodiode.

BACKGROUND OF THE INVENTION

To adopt a photoreceptor as a photodiode of a receiving circuit for free-space optical communication, the receiving circuit receiving and recognizing a faint optical signal which is supplied from a sending circuit and propagated through a space, it is important to prevent the malfunction caused by shot noise.

Provided that a current i flows in the photodiode, shot noise at a PN junction of the photodiode is represented as $\sqrt{(2 \times q \times i \times \Delta f)}$. In other words, the shot noise increases in proportion to the power root of a current value. In the foregoing expression, "q" is an elementary charge and "$\Delta f$" is a frequency band.

When a signal is received in complete darkness, i.e. when a signal is received in a condition with no direct component of light, no current flows in the photodiode so that there is no shot noise at the PN junction of the photodiode.

However, if the threshold voltage of a signal detection circuit is set so as to optimize the sensitivity for a condition that a signal is received with no shot noise (cf. left figure in FIG. 4), a direct current flows into the photodiode in a bright condition (i.e. with a direct component of light), so that the shot noise is generated. This shot noise is amplified along with the signal, and supplied to the signal detection circuit. As a result, the signal detection circuit detects both the signal and the noise, thereby malfunctioning (cf. right figure in FIG. 4).

To prevent this malfunction, it is necessary to set the threshold voltage of the signal detection circuit in such a manner as to deteriorate the sensitivity in darkness. Setting the threshold voltage in this way, however, deteriorates the overall sensitivity.

To prevent such deterioration of the sensitivity, a circuit shown in FIG. 2 has been proposed. In FIG. 2, a current generated in a photodiode PD turns to a corrector current of an NPN transistor Q1 which constitutes, together with a resistor R3, a grounded-base circuit in a current-voltage conversion circuit 11, and is converted to a voltage by a current-voltage conversion resistor R1. Subsequently, only an AC component is drawn by an AC coupled circuit (differentiation circuit) made up of a capacity C1 and a resistors R4 and R5, and then amplified by an amplifier circuit AMP1. Subsequently, an AC component is further drawn by an AC coupled circuit (differentiation circuit) made up of a capacity C2 and a resistor R6. The AC component having been drawn is, by a comparator COMP, compared with a threshold voltage of a threshold voltage generating circuit SVG, so that an optical signal superposed on the incoming light is detected.

When such a conventional circuit is used in a condition with a direct component of light, a DC current flows into the photodiode PD, causing the voltage drop in the resistor R1. As the voltage drop exceeds a forward voltage in a diode D1, a current generated by the photodiode PD is divided so as to reach the resistors R1 and R2. With this, a current voltage conversion resistor value is reduced to be substantially identical with a parallel resistance of the resistors R1 and R2, and hence the conversion gain decreases. In this manner, a noise voltage caused by the shot noise generated in the photodiode PD is reduced, and such malfunction that a noise is mistakenly recognized as a signal is prevented.

However, the conventional circuit shown in FIG. 2 has the following drawback.

The collector voltage of the transistor Q1 varies in accordance with a direct current flowing in the photodiode PD, and this direct current varies in accordance with incoming light. For this reason, when the collector voltage of the transistor Q1 is direct-coupled with the amplifier circuit AMP1, a DC component of the collector voltage of the transistor Q1 is multiplied by the gain. The gain of the amplifier circuit AMP1 is generally set so as to be about 200 times as much as the DC component, in order to increase the sensitivity to detect a signal. Thus, when the DC component of the collector voltage of the transistor Q1 varies for 0.7V, the variation of the output of the amplifier circuit AMP1 reaches 0.7×200=140V. Such a large voltage is impractical because the power supply voltage of the amplifier circuit AMP1 has to be higher than this voltage. In practice, the power-supply voltage has to be about a few volts. On this account, it is necessary to cut the DC component of the collector voltage of the transistor Q1 and allow only the AC component to enter the amplifier circuit AMP1. To do so, the AC coupled circuit made up of the capacity C1 and the resistor R4 has to be provided in the previous stage of the amplifier circuit AMP1.

Furthermore, because of the offset by which the amplifier circuit AMP is always accompanied and the relative accuracy of the resistors R4 and R5, the output from the amplifier circuit AMP1 fluctuates. For instance, when an offset on the input of the amplifier circuit AMP1 is 1 mV, an offset on the output from the amplifier circuit AMP1 is 0.2V (i.e. gained for 200 times). If this amplifier circuit AMP1 is directly connected to the comparator COMP of the signal detection circuit 12, the detecting sensitivity fluctuates for the amount of the offset voltage. To prevent this fluctuation, another AC coupled circuit made up of a capacity C2 and a resistor R6 has to be provided between the output of the amplifier circuit AMP1 and the comparator COMP.

In this manner, in the conventional circuit in FIG. 2, two AC coupled circuits have to be provided between the current voltage conversion circuit 11 and the comparator COMP. With these two AC coupled circuits, a signal pulse is differentiated twice as shown in FIG. 3, so that the signal voltage rises at the end of the signal. Thus, it looks as if the signal continues even after the end thereof, and the comparator COMP of the signal detection circuit 12 may mistakenly detect a nonexistent signal.

SUMMARY OF THE INVENTION

The present invention was done to solve the problem identified above. The objective of the present invention is thus to provide a receiving circuit for free-space optical communication, which can control the output from an amplifier circuit AMP1 not to be varied by the influences of a DC photocurrent and an offset of the amplifier circuit AMP1 itself, without using an AC coupled circuit which induces the problem described with reference to FIG. 3, and also can prevent the malfunction due to shot noise generated in a photodiode PD.

To achieve the objective above, a receiving circuit of the present invention for free-space optical communication of the present invention includes: a photodiode which detects incoming light; a current voltage conversion circuit which converts a photocurrent of the photodiode into a voltage; and a first amplifier circuit which amplifies an output voltage supplied from the current voltage conversion circuit, the receiving circuit being characterized by comprising: a circuit which supplies, to the photodiode, a correction current which cancels influences of (i) a DC photocurrent which flows in the photodiode and is generated by direct component of light and (ii) an offset of the first amplifier circuit, in order to prevent the output voltage supplied from the first amplifier circuit from varying due to the influences; and a circuit which controls conversion gain of the current voltage conversion circuit, in accordance with the correction current.

To achieve the objective above, another receiving circuit of the present invention for free-space optical communication of the present invention includes: a photodiode which detects incoming light; a current voltage conversion circuit which converts a photocurrent of the photodiode into a voltage; a signal detection circuit including a comparator which compares the output voltage supplied from the first amplifier circuit with the reference voltage; and a first amplifier circuit which amplifies an output voltage supplied from the current voltage conversion circuit, the receiving circuit being characterized by comprising: a circuit which supplies, to the photodiode, a correction current which cancels influences of (i) a DC photocurrent which flows in the photodiode and is generated by direct component of light and (ii) an offset of the first amplifier circuit, in order to prevent the output voltage supplied from the first amplifier circuit from varying due to the influences; and a circuit which controls conversion gain of the current voltage conversion circuit, in accordance with the correction current.

To achieve the objective above, a receiving circuit of the present invention for free-space optical communication of the present invention includes: a photodiode which detects incoming light; a current voltage conversion circuit which converts a photocurrent of the photodiode into a voltage; a first amplifier circuit which amplifies a difference between an output voltage supplied from the current voltage conversion circuit and a bias voltage; a second amplifier circuit which receives or outputs a current corresponding to a difference figured out by comparing the output voltage from the first amplifier circuit with a first reference voltage; a capacity which is charged or discharged by the current supplied to or from the second amplifier circuit; a series circuit which is made up of a first field effect transistor and a resistor, the series circuit being connected in parallel to a conversion resistor of the current voltage conversion circuit; and a series circuit made up of (I) a second field effect transistor which supplies a drain current controlled by voltages at terminals of the capacity to the photodiode and (II) a resistor, a gate of the first field effect transistor and a gate of the second field effect transistor having an identical voltage.

In the receiving circuit for free-space optical communication of the present invention, the correction current is supplied to the photodiode in order to prevent the output voltage of the first amplifier circuit from being varied by the influences of (i) the DC photocurrent which flows in the photodiode and is generated by the direct component of light and (ii) the offset of the first amplifier circuit. On this account, the output voltage of the first amplifier circuit is substantially constant irrespective of the DC photocurrent and the offset, so that an AC coupled circuit which is required in the conventional art is not necessary. Meanwhile, when the correction current for canceling out the DC photocurrent flowing in the photodiode is supplied to the photodiode as above, the DC photocurrent is not supplied to the current voltage conversion circuit. For this reason, in a conventional current voltage conversion circuit in which a current voltage conversion resistor is connected in parallel to a diode, the gain of the current voltage cannot be switched.

Taking this into consideration, in the present invention, the conversion gain of the current voltage conversion circuit is controlled in accordance with the correction current, so that the conversion gain is caused to decrease when the DC photocurrent flowing in the photodiode exceeds a predetermined value. As a result, the receiving circuit for free-space optical communication of the present invention can operate without an AC coupled circuit which induces the problem described with reference to FIG. 3, and can prevent the occurrence of the malfunction due to the shot noise generated in the photodiode.

For a fuller understanding of the nature and advantages of the invention, reference should be made to the ensuing detailed description taken in conjunction with the accompanying drawings.

DESCRIPTION OF THE EMBODIMENTS

Figure 1:
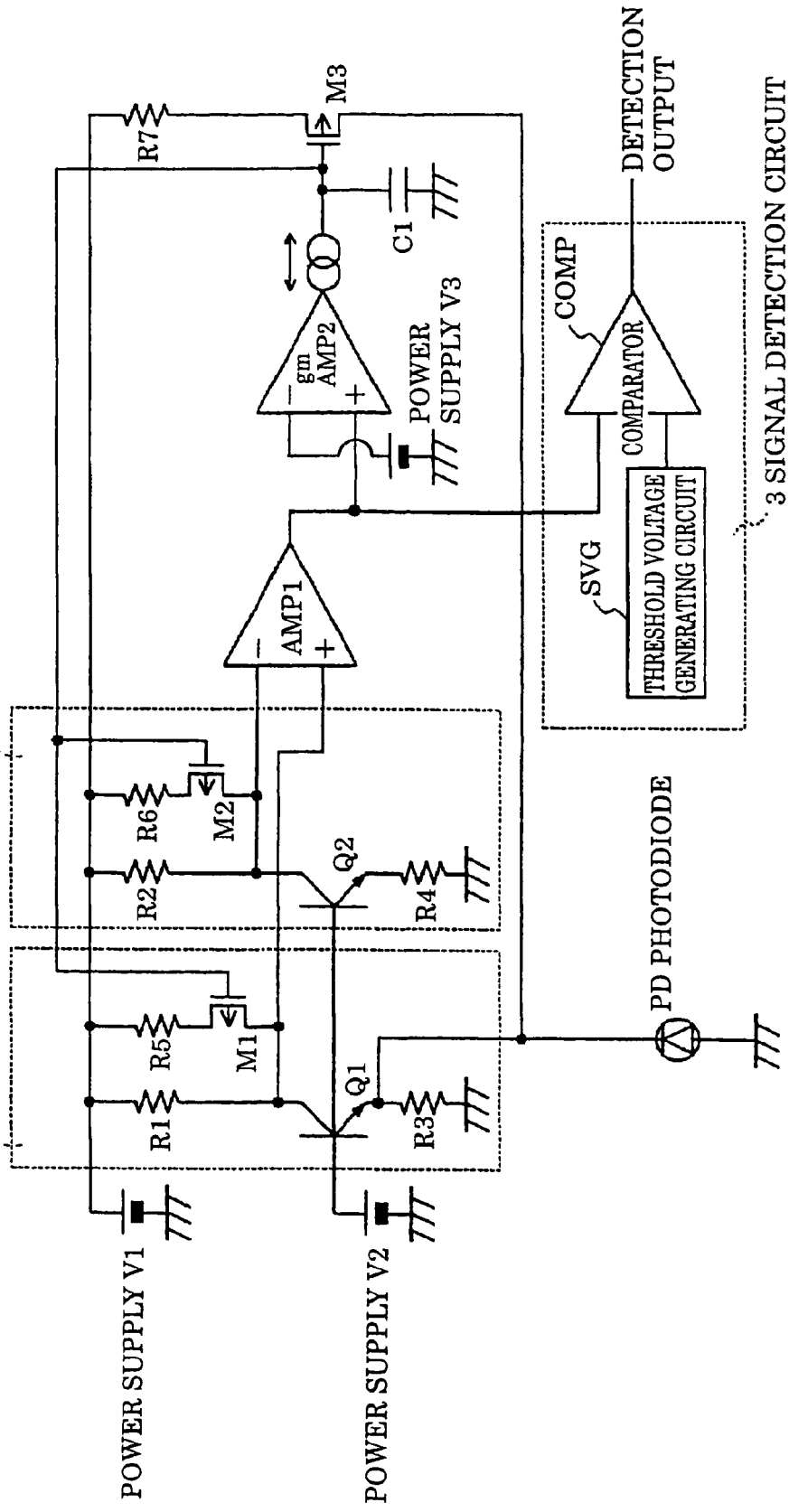
FIG. 1 is a circuit diagram of a receiving circuit for free-space optical communication, in accordance with an embodiment of the present invention.
Figure 2:
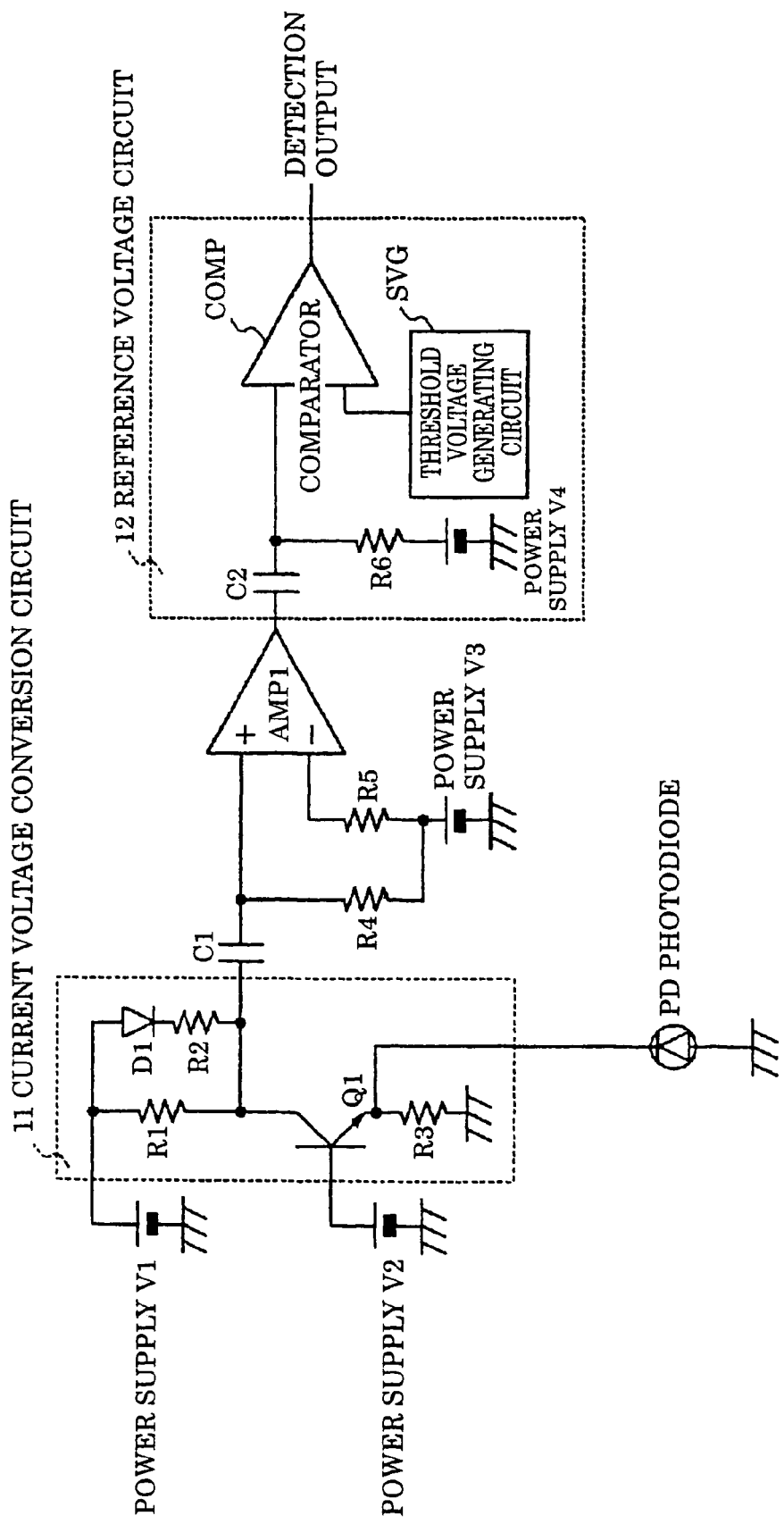
FIG. 2 is a circuit diagram of a conventional receiving circuit for free-space optical communication.

The following will discuss an embodiment of the present invention with reference to figures. As shown in FIG. 1, a receiving circuit for free-space optical communication in accordance with the present embodiment includes: a photodiode PD which detects incoming light; a current voltage conversion circuit 1 which converts a photocurrent of the photodiode PD into a voltage; a reference voltage circuit 2; a first amplifier circuit AMP1 which amplifies the difference between an output voltage from the current voltage conversion circuit 1 and an output voltage from the reference voltage circuit 2; a second amplifier circuit (gm-amp) AMP2 which compares an output voltage from the first amplifier circuit AMP1 with a reference voltage (power supply V3), and receives or outputs a current corresponding to the difference between the output voltage and the reference voltage being compared; a capacity C1 which is charged or discharged by the current supplied to or outputted from the second amplifier circuit AMP2; a field effect transistor (hereinafter, MOS transistor) M3 which supplies, to the photodiode PD, a drain current controlled by the voltages at the respective terminals of the capacity C1; a resistor R7 which is connected in series with the MOS transistor M3; and a signal detection circuit 3 including a comparator COMP which compares the output voltage of the first amplifier circuit AMP1 with a threshold voltage of a threshold voltage generating circuit SVG so as to generate a detection output. Note that, the MOS transistor M3 is arranged such that the resistance between the drain and source increases as the gate voltage increases, while the resistance between the drain and source decreases as the gate voltage decreases.

The current voltage conversion circuit 1 includes: an NPN transistor Q1 which is a part of a grounded-base circuit; a resistor R3 connected to the emitter of the transistor Q1; a current voltage conversion resistor R1 connected to the collector of the transistor Q1; and a series circuit made up of a MOS transistor M1 and a resistor R5. This series circuit is provided in parallel to the current voltage conversion resistor R1. The gate of the MOS transistor M1 is connected to the gate of the MOS transistor M3, and these gates are controlled so as to have an identical voltage. The MOS transistor M1 is identical with the MOS transistor M3 in terms of structure.

The circuit pattern of the reference voltage circuit 2 is identical with that of the current voltage conversion circuit 1. Thus, the transistor Q1 corresponds to a transistor Q2, the resistors R1, R3, and R5 correspond to resistors R2, R4, and R6, respectively, and the MOS transistor M1 corresponds to the MOS transistor M2.

The power supply V1 supplies a drive voltage to the current voltage conversion circuit 1, the reference voltage circuit 2, the MOS transistor M2, and the like. The power supply V2 supplies a bias voltage to the transistors Q1 and Q2.

Now, the following will illustrate how the above-described receiving circuit for free-space optical communication in accordance with the present embodiment operates.

In FIG. 1, the current flowing in the photodiode PD turns to the collector current of the transistor Q1 after passing through the grounded-base circuit of the transistor Q1, and is converted to a voltage by the current voltage conversion resistor R1. The amplifier circuit AMP1 amplifies the difference between this voltage and a reference voltage generated by the reference voltage circuit 2 which is identical with the current voltage conversion circuit 1 in terms of circuitry. The output voltage from the amplifier circuit AMP1 is supplied to the amplifier circuit (gm-amp) AMP2 which performs inputting/outputting in accordance with the difference between the output voltage from the amplifier circuit AMP1 and the reference voltage V3, and then the output voltage from the amplifier circuit AMP1 is supplied to the signal detection circuit 3. In the signal detection circuit 3, the output voltage from the amplifier circuit AMP1 and the threshold voltage of the threshold voltage generating circuit SVG are compared with each other by the comparator COMP, so that the detection output is generated.

In the meantime, the capacity C1 is or discharged by the current supplied to or outputted from the amplifier circuit (gm-amp) AMP2. The MOS transistor M3, which is controlled by voltages which is at the terminals of the capacity C1 and is generated as a result of the charging/discharging of the capacity C1, supplies its drain current to the photodiode PD. With this, a DC current generated in the photodiode PD by the outside light is cancelled as follows.

As the DC current flowing in the photodiode PD is increased by the direct component of light, the collector voltage of the transistor Q1 decreases. Since this collector voltage is supplied to the positive input of the amplifier circuit AMP1, the output from the amplifier circuit AMP1 decreases. This output from the amplifier circuit AMP1 is supplied to the positive input of the amplifier circuit (gm-amp) AMP2, so that the terminal voltage of the capacity C1 (i.e. gate voltage of the M3) decreases as the amplifier circuit AMP2 discharges the capacity C1. For this reason, the drain current of the MOS transistor M3 increases and hence the DC current flowing in the photodiode PD is cancelled. As a result, the collector current of the transistor Q1 decreases while the collector voltage increases. On the other hand, when the DC current flowing in the photodiode PD decreases, the collector voltage of the transistor Q1 increases, the output from the amplifier circuit AMP1 increases, and the terminal voltage of the capacity C1 (i.e. the gate voltage of the M3) increases as the capacity C1 is charged by the amplifier AMP2. Subsequently, the drain current of the MOS transistor M3 decreases, the collector current of the transistor Q1 increases by that much, and the collector voltage of the transistor Q1 decreases. Since the circuit shown in FIG. 1 is a negative feedback circuit, the drain current of the MOS transistor M3 is determined in such a manner as to cancel the DC current flowing in the photodiode PD. Note that, the resistor R7 connected in series with the source of the MOS transistor M3 is provided for adjusting gm (mutual conductance) of the MOS transistor M3.

Since the MOS transistor M1 whose gate has an identical current with the gate of the MOS transistor M3 is connected in parallel to the current voltage conversion resistor R1, the drain current of the MOS transistor M3 increases as the DC current flowing in the photodiode PD increases because of the outside light, so that the DC current flowing in the photodiode PD is cancelled and the gate voltage of the MOS transistor M1 decreases. As a result, the resistance between the source and drain of the MOS transistor M1 decreases and the collector current of the transistor Q1 is divided to the resistor R1 and the MOS transistor M1, and hence the current voltage conversion resistor value decreases and the current voltage conversion gain decreases. For this reason, the voltage noise due to the shot noise generated in the photodiode PD decreases, and the malfunction of the signal detection circuit 3 is thus prevented. Note that, the resistor R5 connected in series with the MOS transistor M1 prevents the resistance of the MOS transistor M1 from excessively decreasing, i.e. prevents the current voltage conversion gain from excessively decreasing.

Since the reference voltage of the amplifier circuit AMP1 is generated by the reference voltage circuit 2 whose circuit pattern is identical with that of the current voltage conversion circuit 1, the output from the current voltage conversion circuit 1 and the reference voltage are influenced in a similar manner by environmental changes and extrinsic noise. The amplifier circuit AMP1 to which the output from the current voltage conversion circuit 1 and the reference voltage are supplied operates in a differential fashion, the influences of environmental changes and extrinsic noise do not appear on the output from the amplifier circuit AMP1. For this reason, stable signal detection is realized.

In this wise, according to the present embodiment, the output voltage from the amplifier circuit AMP1 is compared with the reference voltage, the amplifier circuit (gm-amp) AMP2 which receives or outputs a current corresponding to the difference figured out as a result of the comparison above is provided, and the drain current of the MOS transistor M3, the MOS transistor M3 being controlled by the voltages at the respective terminals of the capacity C1 charged or discharged by the output current from the amplifier circuit (gm-amp) AMP2, is supplied to the photodiode PD. With this, the fluctuation the output from the amplifier circuit AMP1 is eliminated, the fluctuation being caused by the DC current generated by the outside light and the offset of the amplifier circuit AMP1, so that two AC coupled circuit which are required in the conventional art are not necessary. Furthermore, the current voltage conversion resistor R1 is connected in series with the MOS transistor M1, and the gate of the MOS transistor M1 is connected to the gate of the MOS transistor M3 which cancels the DC current generated by the outside light. With this, the current voltage conversion resistor value decreases in accordance with the DC photocurrent generated by the outside light, the noise voltage due to the shot noise generated by the outside light decreases, and as a result the malfunction of the signal detection circuit 3 is prevented.

A first receiving circuit for free-space optical communication of the present invention comprises: a photodiode which detects incoming light; a current voltage conversion circuit which converts a photocurrent of the photodiode into a voltage; and a first amplifier circuit which amplifies an output voltage supplied from the current voltage conversion circuit, the receiving circuit being characterized by comprising: a circuit which supplies, to the photodiode PD, a correction current which cancels influences of (i) a DC photocurrent which flows in the photodiode and is generated by direct component of light and (ii) an offset of the first amplifier circuit, in order to prevent the output voltage supplied from the first amplifier circuit from varying due to the influences; and a circuit which controls conversion gain of the current voltage conversion circuit, in accordance with the correction current.

A second receiving circuit for free-space optical communication of the present invention comprises: a photodiode which detects incoming light; a current voltage conversion circuit which converts a photocurrent of the photodiode into a voltage; a signal detection circuit including a comparator which compares the output voltage supplied from the first amplifier circuit with the reference voltage; and a first amplifier circuit which amplifies an output voltage supplied from the current voltage conversion circuit, the receiving circuit being characterized by comprising: a circuit which supplies, to the photodiode PD, a correction current which cancels influences of (i) a DC photocurrent which flows in the photodiode and is generated by direct component of light and (ii) an offset of the first amplifier circuit, in order to prevent the output voltage supplied from the first amplifier circuit from varying due to the influences; and a circuit which controls conversion gain of the current voltage conversion circuit, in accordance with the correction current.

A third receiving circuit for free-space optical communication of the present invention is arranged in such a manner that, in the first or second receiving circuit, a conversion resistance of the current voltage conversion circuit is varied in accordance with the correction current.

A fourth receiving circuit for free-space optical communication of the present invention is arranged in such a manner that, in the third receiving circuit, a first field effect transistor whose gate voltage varies in accordance with the correction current is connected in parallel to a conversion resistor of the current voltage conversion circuit.

A fifth receiving circuit for free-space optical communication of the present invention is arranged in such a manner that, in the third receiving circuit, a series circuit made up of a first field effect transistor whose gate voltage varies in accordance with the correction current and a resistor is connected in parallel to a conversion resistor of the current voltage conversion circuit.

A sixth receiving circuit for free-space optical communication of the present invention is arranged in such a manner that, in the fourth or fifth receiving circuit, a second field effect transistor which supplies the correction current to the photodiode is further provided, and a gate of the first field effect transistor and a gate of the second field effect transistor have an identical voltage.

A seventh receiving circuit for free-space optical communication is arranged in such a manner that, in the sixth receiving circuit, a source of the second field effect transistor is connected in series with a resistor.

An eighth receiving circuit for free-space optical communication of the present invention is arranged in such a manner that, the sixth or seventh receiving circuit further includes: a second amplifier circuit which receives or outputs a current corresponding to a difference between the output voltage supplied from the first amplifier circuit and the reference voltage; and a capacity which is charged or discharged by a current supplied to or from the second amplifier circuit and supplies a gate voltage to the first field effect transistor and the second field effect transistor A ninth receiving circuit for free-space optical communication of the present invention includes: a photodiode which detects incoming light; a current voltage conversion circuit which converts a photocurrent of the photodiode into a voltage; a first amplifier circuit which amplifies a difference between an output voltage supplied from the current voltage conversion circuit and a bias voltage; a second amplifier circuit which receives or outputs a current corresponding to a difference figured out by comparing the output voltage from the first amplifier circuit with a first reference voltage; a capacity which is charged or discharged by the current supplied to or from the second amplifier circuit; a series circuit which is made up of a first field effect transistor and a resistor, the series circuit being connected in parallel to a conversion resistor of the current voltage conversion circuit; and a series circuit made up of (I) a second field effect transistor which supplies a drain current controlled by voltages at terminals of the capacity to the photodiode and (II) a resistor, a gate of the first field effect transistor and a gate of the second field effect transistor having an identical voltage.

A tenth receiving circuit for free-space communication of the present invention is arranged in such a manner that, in the ninth receiving circuit, as a bias circuit which supplies the bias voltage, a circuit is identical with the current voltage conversion circuit in terms of circuitry is adopted.

In the receiving circuit for free-space optical communication of the present invention, the correction current is supplied to the photodiode in order to prevent the output voltage of the first amplifier circuit from being varied by the influences of (i) the DC photocurrent which flows in the photodiode and is generated by the direct component of light and (ii) the offset of the first amplifier circuit. On this account, the output voltage of the first amplifier circuit is substantially constant irrespective of the DC photocurrent and the offset, so that an AC coupled circuit which is required in the conventional art is not necessary. Meanwhile, when the correction current for canceling out the DC photocurrent flowing in the photodiode is supplied to the photodiode as above, the DC photocurrent is not supplied to the current voltage conversion circuit. For this reason, in a conventional current voltage conversion circuit in which a current voltage conversion resistor is connected in parallel to a diode, the gain of the current voltage cannot be switched.

Figure 3:
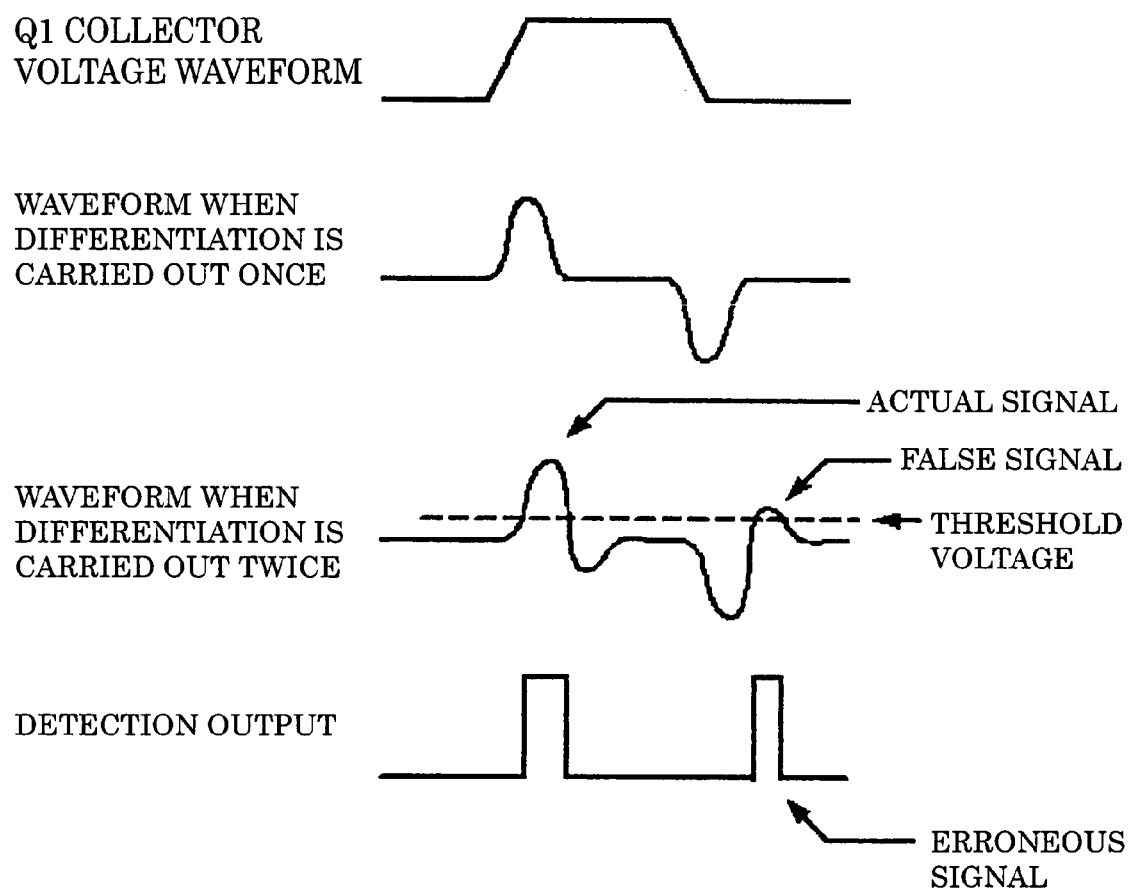
FIG. 3 is an waveform chart for illustrating the setback of the conventional receiving circuit for free-space optical communication.
Figure 4:
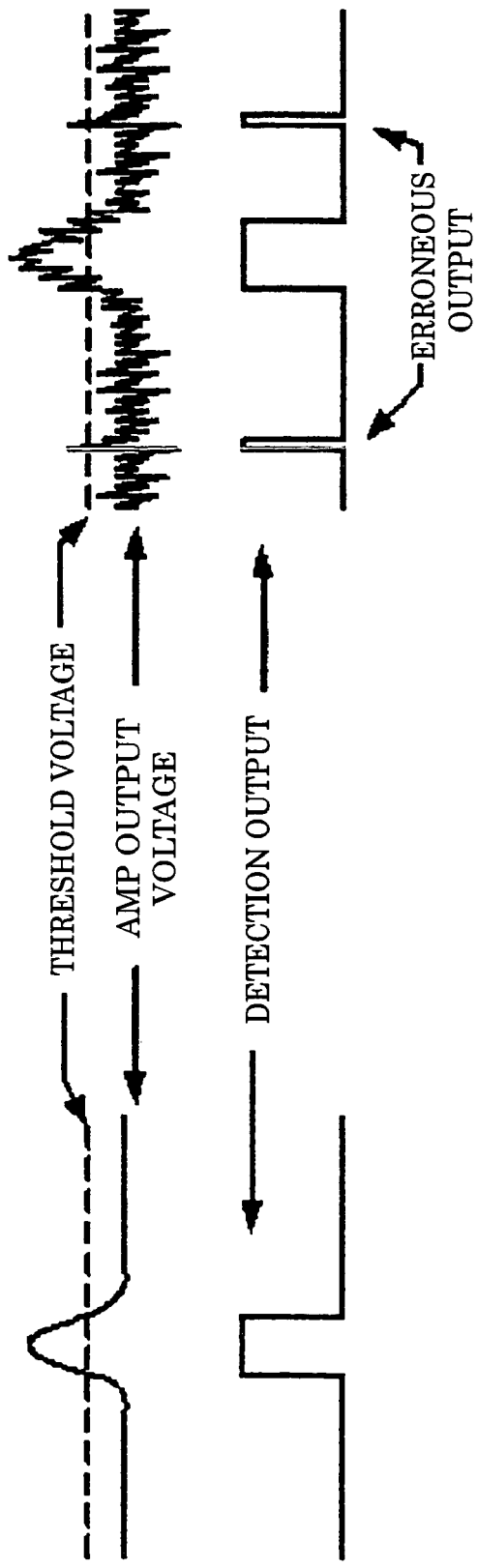
FIG. 4 is an waveform chart for illustrating the shot noise generated in a photodiode.

Taking this into consideration, in the present invention, the conversion gain of the current voltage conversion circuit is controlled in accordance with the correction current, so that the conversion gain is caused to decrease when the DC photocurrent flowing in the photodiode exceeds a predetermined value. As a result, the receiving circuit for free-space optical communication of the present invention can operate without an AC coupled circuit which induces the problem described with reference to FIG. 3, and can prevent the occurrence of the malfunction due to the shot noise generated in the photodiode.

As described above, the present invention is suitably applicable to a receiving circuit for free-space optical communication, which adopts a photodiode as a photoreceptor, and also to a receiving circuit for free-space optical communication, which receives and detects only an optical signal from incoming light in which a faint optical signal is superposed to a direct component of the outside light.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A receiving circuit for free-space optical communication, comprising:
    a photodiode which detects incoming light;
    a current voltage conversion circuit which converts a photocurrent of the photodiode into a voltage;
    a first amplifier circuit which amplifies an output voltage supplied from the current voltage conversion circuit;
    a circuit which supplies, to the photodiode, a correction current which cancels influences of (i) a DC photocurrent which flows in the photodiode and is generated by direct component of light and (ii) an offset of the first amplifier circuit, in order to prevent the output voltage supplied from the first amplifier circuit from varying due to the influences; and
    a circuit which controls conversion gain of the current voltage conversion circuit, in accordance with the correction current.

2. The receiving circuit as defined in claim 1, further comprising a signal detection circuit including a comparator which compares the output voltage supplied from the first amplifier circuit with a reference voltage.

3. The receiving circuit as defined in claim 1, wherein, a conversion resistance of the current voltage conversion circuit is varied in accordance with the correction current.

4. The receiving circuit as defined in claim 3, wherein, a first field effect transistor whose gate voltage varies in accordance with the correction current is connected in parallel to a conversion resistor of the current voltage conversion circuit.

5. The receiving circuit as defined in claim 3, wherein, a series circuit made up of a first field effect transistor whose gate voltage varies in accordance with the correction current and a resistor is connected in parallel to a conversion resistor of the current voltage conversion circuit.

6. The receiving circuit as defined in claim 5, further comprising a second field effect transistor which supplies the correction current to the photodiode, a gate of the first field effect transistor and a gate of the second field effect transistor having an identical voltage.

7. The receiving circuit as defined in claim 6, wherein, a source of the second field effect transistor is connected in series with a resistor.

8. The receiving circuit as defined in claim 6, further comprising:
    a second amplifier circuit which receives or outputs a current corresponding to a difference between the output voltage supplied from the first amplifier circuit and the reference voltage; and
    a capacity which is charged or discharged by a current supplied to or from the second amplifier circuit and supplies a gate voltage to the first and second field effect transistors.

9. The receiving circuit for free-space optical communication as set forth in claim 1, wherein
    the first amplifier circuit amplifies a difference between an output voltage supplied from the current voltage conversion circuit and a bias voltage,
    the circuit which supplies the correction current to the photodiode is constituted of (i) a second amplifier circuit which receives or outputs a current corresponding to a difference figured out by comparing the output voltage from the first amplifier circuit with a first reference voltage, (ii) a capacity which is charged or discharged by the current supplied to or from the second amplifier circuit, and (iii) a series circuit which is made up of (I) a second field effect transistor which supplies a drain current controlled by voltages at terminals of the capacity to the photodiode and (II) a resistor, and the circuit which controls conversion gain of the current voltage conversion circuit is constituted of a series circuit which is made up of a first field effect transistor and a resistor, the series circuit being connected in parallel to a conversion resistor of the current voltage conversion circuit, whereby a gate of the first field effect transistor and a gate of the second field effect transistor having an identical voltage.

10. The receiving circuit as defined in claim 9, wherein, as a bias circuit which supplies the bias voltage, a circuit is identical with the current voltage conversion circuit in terms of circuitry is adopted.

* * * * *